United States Patent Office 2,818,361

Patented Dec. 31, 1957

2,818,361

HEAT TREATMENT OF SILICON TRANSISTOR BARS

Robert E. Anderson, Richardson, and William L. Medlin, Dallas, Tex., assignors to Texas Instruments Incorporated, Dallas, Tex., a corporation of Delaware No Drawing. Application November 13, 1956
Serial No. 621,499

4 Claims. (Cl. 148—33)

This invention relates to grown junction silicon transistors, and particularly to an improved method of making the grown junction semi-conductor bars that form the basic part thereof.

Typical grown junction transistors comprise transistor bars about .030 inch square by about .25 inch in length, appropriately mounted and provided with electrical connections. These bars are usually cut from a crystal grown from molten germanium or silicon. During the growing process small amounts of impurities are added to the melt to cause the conductivity characteristics of the growing crystal to change so as to form end portions of one type of conductivity and a thin base layer intermediate the ends of the opposite type of conductivity. Transistor bars are then cut from the crystal so that the base layer extends transversely of the bars somewhere near their midpoint. As a result, the final transistor bar may have end portions of n-type conductivity and a very narrow center layer extending transversely of the bar and of p-type conductivity. Conversely, the bars may have end portions of p-type conductivity and a base layer of n-type conductivity.

Transistors are currently being made of both germanium and silicon, and various manufacturers use various amounts of various impurities to produce the desired end portions and base layer. The present invention relates to silicon transistors, and particularly to silicon transistor bars containing as impurities, that is to say doped with, antimony, aluminum and arsenic in the collector, base and emitter regions, respectively. In the process of growing such crystals, the molten silicon is originally doped with a sufficient amount of antimony to cause the first part of the crystal, which will eventually form the collector portion of the transistor bars, to have n-type conductivity. After that portion of the crystal has been grown, a sufficient amount of aluminum is added to the mix to cause the next grown part of the crystal, which will eventually be the base layer of the transistor bars, to have p-type conductivity. After this very thin layer of crystal is grown, a quantity of arsenic sufficient to cause the remainder of the crystal to have n-type conductivity is added to the melt. This final portion of the crystal will eventually form the emitter portion of the transistor bar.

One of the important characteristics of a transistor is its cutoff frequency, and it is highly desirable to have this cutoff frequency as high as possible without adversely affecting the other characteristics of the transistor. In accordance with this invention, it has been found that grown junction silicon transistor bars of certain kinds can be greatly improved in this respect by proper heat treatment.

The transistor bars to which this invention applies are of the grown junction silicon type in which the collector portion of the bar is doped with antimony to give it n-type conductivity; the base portion of the bar is additionally doped with aluminum to give it p-type conductivity; and the emitter portion of the bar is still further doped with arsenic to give it n-type conductivity. The principles of this invention apply to bars of this type that lie in what is normally considered the medium or lightly doped range, that is, those that contain only enough of the impurities to cause the conductivity of the base layer to have a resistivity of about 0.5 to 3.0 ohm-centimeters. Attempts to apply the principles of this invention to transistor bars having a considerably lower resistivity, of, for example, below 0.3 ohm-centimeter, have failed to produce worthwhile improvement. The principles of this invention also apply to transistor bars having relatively narrow base layers of between about .0002 and .0007 inch in thickness. Again, attempts to apply this invention to bars having substantially thicker base layers have failed to produce significant improvement.

The process of this invention comprises heating transistor bars of the type above described at a temperature of around 500° C. to 550° C. for a period of around fifteen minutes to two hours. The result is a material improvement in the high frequency characteristics of the resultant transistors, without substantial impairment of the low frequency current gain.

As a specific example of the practice of this invention, a series of transistor bars were prepared so as to have a base resistivity of 0.8 ohm-centimeter. The melt from which the crystal for these bars was grown was first doped with sufficient antimony to produce a crystal resistivity of 1.5 ohm-centimeters, then when the collector portion of the crystal had been grown in the usual manner, sufficient aluminum was added to the melt to produce a concentration in the subsequently grown section of the crystal of $2.8\times10^{16}$ aluminum atoms per cc. of crystal, and then as soon as the base layer has been grown, arsenic in an amount sufficient to produce a concentration of $10^{19}$ atoms per cc. in the subsequently grown section of the crystal was added and the emitter portion grown. It will be appreciated that the actual amounts of antimony, aluminum, and arsenic required to produce the above mentioned resistivities and concentrations in the crystal will vary depending on other factors arbitrarily chosen such as resistivity of the starting material, melt temperature, pull rate and whether or not the doping material is in a pure form or is alloyed with semiconductor material. Several of the bars from this crystal were heated at 550° C. for thirty minutes, and several others were heated at 550° C. for ninety minutes. Unheated bars from this crystal, and those heated for thirty minutes and those heated for ninety minutes all showed an average low-frequency current gain of around .92 to .95. The unheated bars, however, had a cutoff frequency (frequency in megacycles at which $\alpha/\alpha_0=0.707$) averaging about 4 to 5 megacycles, while those heated for thirty minutes had a cutoff frequency averaging between 7 and 8 megacycles, and those heated for ninety minutes had a cutoff frequency averaging over 20 megacycles. The unneutralized power gain in decibels for the unheated bars averaged about 5 decibels, for the bars heated thirty minutes averaged about 7 decibels, and for the bars heated ninety minutes averaged about 14 decibels.

As another specific example of the practice of this invention, a lightly doped crystal with a base layer resistivity of about 3 ohm-centimeters was prepared in a similar manner but using a lower concentration of aluminum. Transistor bars were cut therefrom and several were heated for a period of twenty minutes. Several others were heated for ninety minutes. Again the unheated bars and those heated twenty and ninety minutes all had about the same low-frequency gain, which was about .90. The heating markedly improved the cutoff frequency, however. The unheated bars had a cutoff frequency averaging about 4 megacycles; the twenty-minute heated bars a cutoff frequency averaging about 9 megacycles; and the ninety-minute bars a cutoff frequency averaging about 16 megacycles.

It will at once be apparent that certain modifications may be made in the method of treating silicon transistor bars described above, and these are contemplated within the scope of this invention. However, it should be noted that prolongation of the heating time tends to cause short-circuiting of the emitter-to-collector path, as does also the raising of the temperature of heating. Ordinarily, however, times up to as much as four hours can be utilized and temperatures as high as 650° C. However, most of the improvement in the cutoff frequency characteristic of the transistor bars appears to occur within a relatively short period of time of around an hour to an hour and a half, and thereafter continued heating appears to be of little usefulness. Similarly, a temperature of 500° C. to 550° C. appears to be adequate to cause the change to take place, and a higher temperature does not appear to be particularly beneficial.

The beneficial effects of this invention are also found to be limited to those crystals which have relatively thin base layers. When the thickness of the base layer is greater than 0.0007 inch, the improvement effected by the practice of the process of this invention becomes of too small an order to be worth-while.

Actual tests with heavily doped crystals, the base layer of which had a resistivity of about 0.3 ohm-centimeter, indicated that the practice of the process of this invention on such crystals did not produce worth-while improvement.

What is claimed is:

1. A method of making transistor bars that comprises forming a grown junction silicon transistor bar comprising a collector portion doped with antimony to give it n-type conductivity, a base portion between about .0002 and .0007 inch in thickness additionally doped with sufficient aluminum to give it p-type conductivity and a resistivity of about 0.5 to 3.0 ohm-centimeters, and an emitter portion still further doped with arsenic to give it n-type conductivity; and heating said bar to around 500° C. to 550° C. for around fifteen minutes to two hours.

2. A transistor bar prepared in accordance with the method of claim 1.

3. A method of making transistor bars that comprises forming a grown junction silicon transistor bar comprising a collector portion doped with antimony to give it n-type conductivity, a base portion between .0002 and .0007 inch in thickness additionally doped with sufficient aluminum to give it a p-type conductivity and a resistivity of about 0.8 ohm-centimeter, an emitter portion still further doped with arsenic to give it n-type conductivity; and heating said bar to around 500° C. to 550° C. for around one and one-half hours.

4. A transistor bar made in accordance with the method of claim 3 and having a cutoff frequency of around 20 megacycles.

No references cited.